(12) United States Patent
Zhang et al.

(10) Patent No.: US 9,620,651 B2
(45) Date of Patent: Apr. 11, 2017

(54) THIN FILM TRANSISTOR, MANUFACTURING METHOD THEREOF AND ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Wenyu Zhang, Beijing (CN); Zongmin Tian, Beijing (CN); Jing Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 173 days.

(21) Appl. No.: 14/388,634

(22) PCT Filed: Dec. 4, 2013

(86) PCT No.: PCT/CN2013/088543
§ 371 (c)(1),
(2) Date: Sep. 26, 2014

(87) PCT Pub. No.: WO2014/183422
PCT Pub. Date: Nov. 20, 2014

(65) Prior Publication Data
US 2016/0225914 A1    Aug. 4, 2016

(30) Foreign Application Priority Data

May 13, 2013  (CN) .......................... 2013 1 0175197

(51) Int. Cl.
H01L 27/12      (2006.01)
H01L 29/786     (2006.01)
H01L 29/417     (2006.01)

(52) U.S. Cl.
CPC ...... *H01L 29/78696* (2013.01); *H01L 27/127* (2013.01); *H01L 27/1222* (2013.01);
(Continued)

(58) Field of Classification Search
CPC ..... H01L 21/336; H01L 27/12; H01L 29/423; H01L 29/786; H01L 27/1288;
(Continued)

(56) References Cited

U.S. PATENT DOCUMENTS 6,144,422 A * 11/2000 Lee .................. H01L 29/78642
                                                    257/59
2002/0003964 A1    1/2002 Kanbara et al.
(Continued)

FOREIGN PATENT DOCUMENTS

CN    1326178 A     12/2001
CN   101546077 A     9/2009
(Continued)

OTHER PUBLICATIONS

International Search Report Appln. No. PCT/CN2013/088543; Dated Mar. 13, 2014.
(Continued)

*Primary Examiner* — Fazli Erdem
(74) *Attorney, Agent, or Firm* — Ladas & Parry LLP

(57) ABSTRACT

A thin film transistor, a manufacturing method thereof and an array substrate are provided. The thin film transistor includes a gate electrode, a gate insulation layer, an active layer, a source electrode and a drain electrode provided on a base substrate, and along a direction perpendicular to the base substrate, the source electrode and the drain electrode
(Continued)

are respectively provided at opposite both sides of the active layer, and the source electrode and the drain electrode contacts the active layer.

12 Claims, 5 Drawing Sheets

(52) U.S. Cl.
CPC .... *H01L 27/1225* (2013.01); *H01L 29/41733* (2013.01); *H01L 29/7869* (2013.01); *H01L 29/78642* (2013.01); *H01L 29/78669* (2013.01)

(58) Field of Classification Search
CPC ............. H01L 27/1214; H01L 27/1222; H01L 27/1225; H01L 27/127; H01L 29/78696; H01L 29/7869; H01L 29/78669
See application file for complete search history.

(56) References Cited

U.S. PATENT DOCUMENTS

| | | | |
|---|---|---|---|
| 2007/0001172 A1* | 1/2007 | Yu | H01L 27/1288 257/66 |
| 2008/0164470 A1* | 7/2008 | Wang | H01L 27/1214 257/59 |
| 2011/0227148 A1 | 9/2011 | Reynes et al. | |
| 2012/0161094 A1 | 6/2012 | Huo et al. | |
| 2012/0292628 A1* | 11/2012 | Tian | H01L 29/66765 257/72 |
| 2014/0048826 A1* | 2/2014 | Gao | H01L 29/78642 257/88 |
| 2014/0070219 A1* | 3/2014 | Shen | H01L 21/77 257/59 |
| 2015/0102338 A1* | 4/2015 | Kong | H01L 29/42384 257/43 |
| 2015/0137126 A1* | 5/2015 | Shen | H01L 21/77 257/59 |
| 2016/0013242 A1* | 1/2016 | Yang | H01L 27/1214 257/292 |

FOREIGN PATENT DOCUMENTS

| | | |
|---|---|---|
| CN | 102544049 A | 7/2012 |
| CN | 103311310 A | 9/2013 |
| JP | 03-056940 A | 3/1991 |

OTHER PUBLICATIONS

Written Opinion of the International Searching Authority Appl. No. PCT/CN2013/088543; Dated Mar. 13, 2014.
Second Chinese Office Action Appln. No. 201310175197.8; Dated Sep. 23, 2015.
First Chinese Office Action Appln. No. 201310175197.8; Dated Mar. 30, 2015.
International Search Report Appln. No. PTC/CN2013/088543; Dated Mar. 13, 2014.

* cited by examiner

THIN FILM TRANSISTOR, MANUFACTURING METHOD THEREOF AND ARRAY SUBSTRATE

TECHNICAL FIELD

The embodiments of the present invention relate to a thin film transistor, a manufacturing method thereof and an array substrate.

BACKGROUND

A thin film transistor liquid crystal display (TFT-LCD) has been dominant in the current marker due to its small volume, low power consuming, no irradiation and so on.

An array substrate is one of the important components of the thin film transistor liquid crystal display, as shown by a cross-sectional structural view in FIG. 1, the array substrate mainly comprises a base substrate 10, a gate electrode 20, a gate insulation layer 30, an active layer 40, a source/drain metal layer comprising a source electrode 501 and a drain electrode 502, a protection layer 60 and a pixel electrode layer 70 provided on the base substrate 10.

An ON-state current of a thin film transistor can be expressed by $$I_{on} = \mu_{eff}(\varepsilon_{ins}\varepsilon_0 / t_{ins})\frac{W}{L}(V_{gs} - V_{th})V_{ds},$$

wherein $\mu_{eff}$ is an equivalent carrier mobility, $t_{ins}$ is a thickness of the gate insulation layer, $$\frac{\varepsilon_{ins}\varepsilon_0}{t_{ins}}$$

is a capacitance of the gate insulation layer per unit area, W is a channel width, L is a channel length, Vgs is a gate-source voltage, Vds is a drain-source voltage and Vth is a threshold voltage. From above, it can be seen that the smaller the channel length, the larger the On-state current of the TFT. Herein, the channel length L is a distance between the source electrode and the drain electrode, e.g. as denoted by the double-arrow in FIG. 1.

However, during manufacturing the array substrate, due to a process limitation in the prior art, the channel length of the thin film transistor can generally be reduced to 3 μm-4 μm, which makes the ON-state current of the thin film transistor not very large.

SUMMARY

The embodiments of the present invention provide a thin film transistor, a manufacturing method thereof and an array substrate with a shortened channel length, so that an ON-state current can be increased and hence the characteristic of the thin film transistor can be improved.

In one aspect, an embodiment of the present invention provides a thin film transistor, comprising a gate electrode, a gate insulation layer, an active layer, a source electrode and a drain electrode provided on a base substrate, wherein along a direction perpendicular to the base substrate, the source electrode and the drain electrode are respectively provided at opposite both sides of the active layer, and the source electrode and the drain electrode contacts the active layer.

In another aspect, an embodiment of the present invention provides an array substrate including the above thin film transistor.

In still another aspect, an embodiment of the present invention provides a method for manufacturing a thin film transistor, comprising: forming a gate electrode, a gate insulation layer, an active layer, a source electrode and a drain electrode on a base substrate, wherein the source electrode and the drain electrode are respectively provided at opposite both sides of the active layer along a direction perpendicular to the base substrate, and the source electrode and the drain electrode contacts the active layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
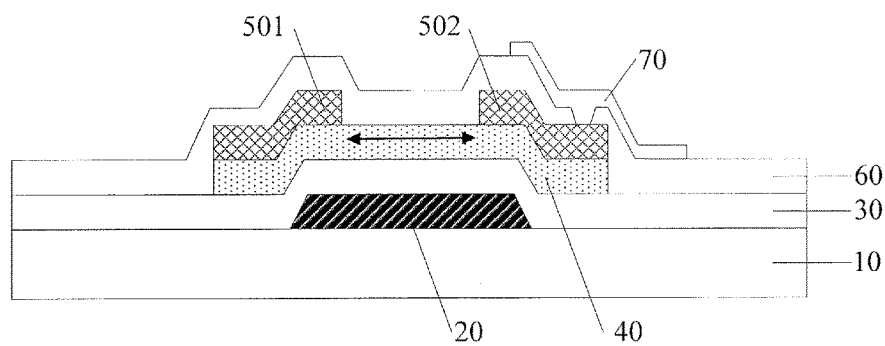
FIG. 1 is a cross-sectional structural view of an array substrate in the prior art.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present invention provides a thin film transistor, as shown in FIGS. 2-5, the thin film transistor comprises a gate electrode 20, a gate insulation layer 30, an active layer 40, a source electrode 501 and a drain electrode 502 disposed on a base substrate 10, wherein along a direction perpendicular to the base substrate, the source electrode 501 and the drain electrode 502 are respectively provided at opposite both sides of the active layer 40 and contact the active layer 40. Furthermore, the gate insulation layer 30 is located between the gate electrode 40 and the active layer 40.

It is to be noted that the source electrode 501 and the drain electrode 502 may be respectively disposed at both sides of the active layer 40 and contact the active layer 40 in two ways, one of which is that during manufacturing the thin film transistor, the source electrode 501 is firstly formed, and then the active layer 40 and the drain electrode 502 are sequentially formed, such that the source electrode 501 contacts a lower surface of the active layer 40 and the drain electrode 502 contacts an upper surface of the active layer 40; and the other of which is that during manufacturing the thin film transistor, the drain electrode 502 is firstly formed, and then the active layer 40 and the source electrode 501 are sequentially formed, such that the drain electrode 502 contacts the lower surface of the active layer 40 and the source electrode 501 contacts the upper surface of the active layer 40. In addition, any other pattern layer may be formed therebetween and the embodiment of the present invention will not make a limitation to this.

A contacting manner between the source and drain electrodes 501 and 502 and the active layer 40 is not limited herein, for example, the source and drain electrodes 501 and 502 may directly contact the active layer 40 or the source and drain electrodes 501 and 502 may contact the active layer 40 via through holes.

The embodiment of the present invention provides a thin film transistor, the thin film transistor comprises a gate electrode, a gate insulation layer, an active layer, a source electrode and a drain electrode, wherein along a direction perpendicular to a base substrate, the source electrode and the drain electrode are respectively provided at both sides of the active layer and contact the active layer. Since a channel length of the thin film transistor is determined by a thickness of the active layer, by properly setting the thickness of the active layer located between the source electrode and the drain electrode, the channel length may be shortened, and thus an ON-state current of the thin film transistor can be increased and hence the characteristic of the thin film transistor can be improved.

It is noted that the channel length determined by the thickness of the active layer as described in all the embodiments of the present invention is equivalent to the channel length between the source and drain electrodes of the thin film transistor in the prior art.

Based on the above description, an exemplar structure of the thin film transistor provided by an embodiment of the present invention may be as follows: the source electrode 501 is provided between the base substrate 10 and the active layer 40, and the drain electrode 502 is provided at a side of the active layer 40 away from the base substrate.

Figure 2:
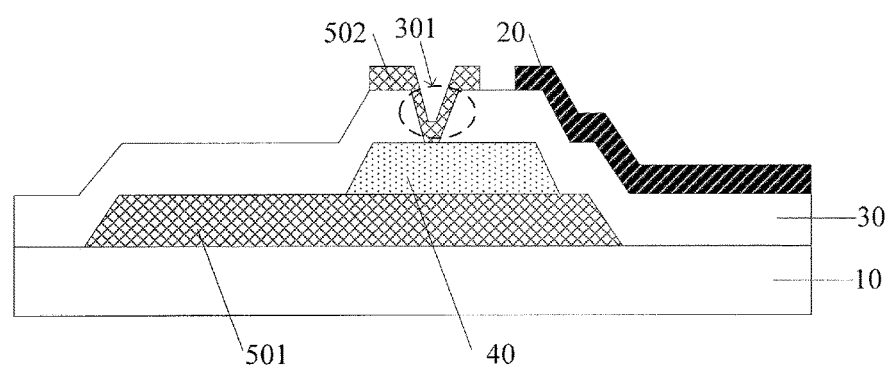
FIG. 2 is a structural schematic view of a thin film transistor according to an embodiment of the present invention.

Furthermore, as shown in FIG. 2, the gate insulation layer 30 may be provided between the drain electrode 502 and the active layer 40; the drain electrode 502 contacts the active layer 40 through a first through hole 301 provided in the gate insulation layer; the gate electrode 20 is provided in the same layer as the drain electrode 502, the gate insulation layer 30 is provided between the gate electrode 20 and the active layer 40, and the gate electrode 20 is not connected with the drain electrode 502.

It is to be noted here that the gate electrode 20 and the drain electrode 502 being provided in the same layer means that the gate electrode 20 and the drain electrode 502 are formed by performing one patterning process to the same metal film. Thus, the number of the patterning processes can be reduced and the cost can be decreased.

Herein, the active layer 40 may be a metal oxide semiconductor active layer, or an amorphous silicon semiconductor layer. When being the amorphous silicon semiconductor layer, the active layer 40 may further comprise ohmic contact layers located at opposite both sides of the amorphous silicon semiconductor layer.

Furthermore, another exemplar structure of the thin film transistor provided by an embodiment of the present invention may be that the drain electrode 502 is provided between the base substrate 10 and the active layer 40, and the source electrode 501 is provided at a side of the active layer away from the base substrate 10.

Figure 3:
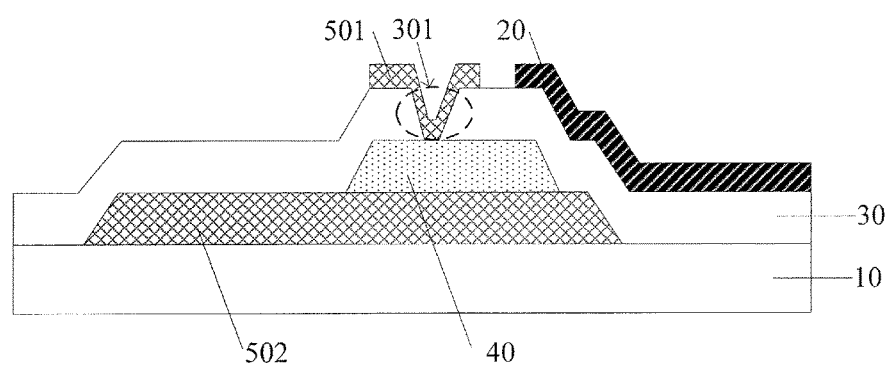
FIG. 3 is a structural schematic view of another thin film transistor according to an embodiment of the present invention.

On this basis, furthermore, as shown in FIG. 3, the gate insulation layer 30 may be provided between the source electrode 501 and the active layer 40, and the source electrode 501 contacts the active layer 40 through a first through hole 301 provided in the gate insulation layer 30; the gate insulation layer 30 is provided between the gate electrode 20 and the active layer 40, and the gate electrode 20 is provided in the same layer as the source electrode 501, and the gate electrode is not connected with the source electrode 501.

It is to be noted here that the gate electrode 20 and the source electrode 501 being provided in the same layer means that the gate electrode 20 and the source electrode 501 are formed by performing one patterning process to the same metal film. Thus, the number of the patterning processes can be reduced and the cost can be decreased.

Herein, the active layer 40 may be a metal oxide semiconductor active layer, or an amorphous silicon semiconductor layer. When being the amorphous silicon semiconductor layer, the active layer 40 may further comprise ohmic contact layers located at opposite both sides of the amorphous silicon semiconductor layer.

The above two structures of the thin film transistor will be further described in detail.

A First Embodiment

Figure 4:
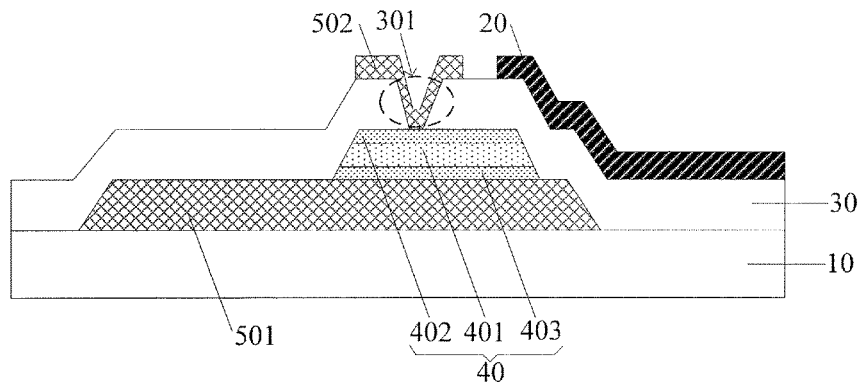
FIG. 4 is a structural schematic view of still another thin film transistor according to an embodiment of the present invention.

The first embodiment provides a thin film transistor, as shown in FIG. 4, the thin film transistor comprises a source electrode 501 provided on a base substrate 10, an active layer 40 provided on the source electrode, a drain electrode 502 provided above the active layer, and a gate insulation layer 30 provided between the active layer and the drain electrode as well as a gate electrode 20 provided above the gate insulation layer.

Herein, the active layer 40 comprises an amorphous silicon semiconductor layer 401 located in the middle thereof, a first ohmic contact layer 402 located above the amorphous silicon semiconductor layer 401 and a second ohmic contact layer 403 located below the amorphous silicon semiconductor layer.

The source electrode 501 contacts the second ohmic contact layer 403 of the active layer 40, and the drain electrode 502 is in the same layer as the gate electrode 20 but is not connected thereto, and the drain electrode 502 contacts the first ohmic contact layer 402 of the active layer 40 through a first through hole 301 provided in the gate insulation layer 30.

It is to be noted that an embodiment of the present invention is not limited to a structure in which the active layer comprises the amorphous silicon semiconductor layer and the first and second ohmic contact layers, and the active layer may also be a metal oxide semiconductor active layer.

The present embodiment provides a thin film transistor comprising a source electrode, an active layer, a gate insulation layer provided sequentially on a base substrate, and a drain electrode and a gate electrode provided in a same layer without connection. Herein, the active layer comprises an amorphous silicon semiconductor layer located in the middle thereof, and a first ohmic contact layer and a second ohmic contact layer respectively provided above and below the amorphous silicon semiconductor layer. The source electrode contacts the second ohmic contact layer, and the drain electrode contacts the first ohmic contact layer through a first through hole provided in the gate insulation layer. Since the channel length of the thin film transistor is determined by a thickness of the active layer, by properly setting the thickness of the active layer, the channel length can be shortened, and thus an ON-state current of the thin film transistor can be increased and hence the characteristic of the thin film transistor can be improved.

A Second Embodiment

Figure 5:
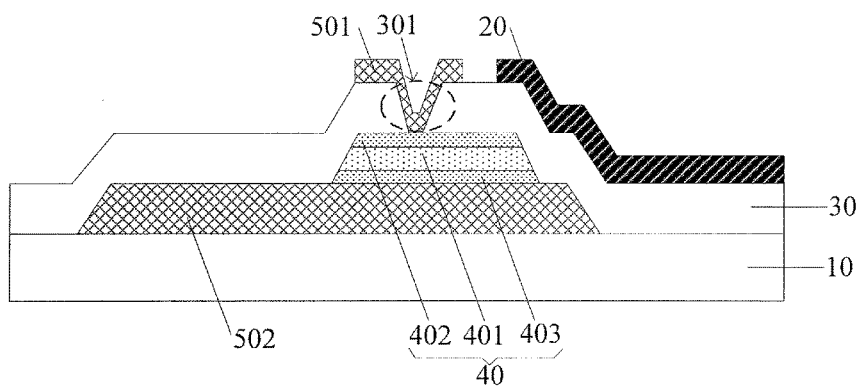
FIG. 5 is a structural schematic view of yet another thin film transistor according to an embodiment of the present invention.

The present embodiment provides a thin film transistor, as shown in FIG. 5, the thin film transistor comprises a drain electrode 502 provided on a base substrate 10, an active layer 40 provided on the drain electrode, a source electrode 501 provided above the active layer, and a gate insulation layer 30 provided between the active layer and the source electrode as well as a gate electrode 20 provided above the gate insulation layer.

Herein, the active layer 40 comprises an amorphous silicon semiconductor layer 401 located in the middle thereof, a first ohmic contact layer 402 located above the amorphous silicon semiconductor layer 401 and a second ohmic contact layer 403 located below the amorphous silicon semiconductor layer.

The drain electrode 502 contacts the second ohmic contact layer 403 of the active layer 40, and the source electrode 501 is in the same layer as the gate electrode 20 but is not connected thereto, and the source electrode 501 contacts the first ohmic contact layer 402 of the active layer 40 through a first through hole 301 provided in the gate insulation layer 30.

It is to be noted that an embodiment of the present invention is not limited to a structure in which the active layer comprises the amorphous silicon semiconductor layer and the first and second ohmic contact layers, and the active layer may also be a metal oxide semiconductor active layer.

The present embodiment provides a thin film transistor comprising a drain electrode, an active layer, a gate insulation layer provided sequentially on a base substrate, and a source electrode and a gate electrode provided in a same layer without connection. Herein, the active layer comprises an amorphous silicon semiconductor layer located in the middle thereof, and a first ohmic contact layer and a second ohmic contact layer respectively provided above and below the amorphous silicon semiconductor layer. The drain electrode contacts the second ohmic contact layer, and the source electrode contacts the first ohmic contact layer through a first through hole provided in the gate insulation layer. Since the channel length of the thin film transistor is determined by a thickness of the active layer, by properly setting the thickness of the active layer, the channel length can be shortened, and thus an ON-state current of the thin film transistor can be increased and hence the characteristic of the thin film transistor can be improved.

It is to be noted that the thin film transistor provided by an embodiments of the present invention is not limited the structure as described with reference to the above two embodiments and may have other structures, and will not be further described.

Figure 6:
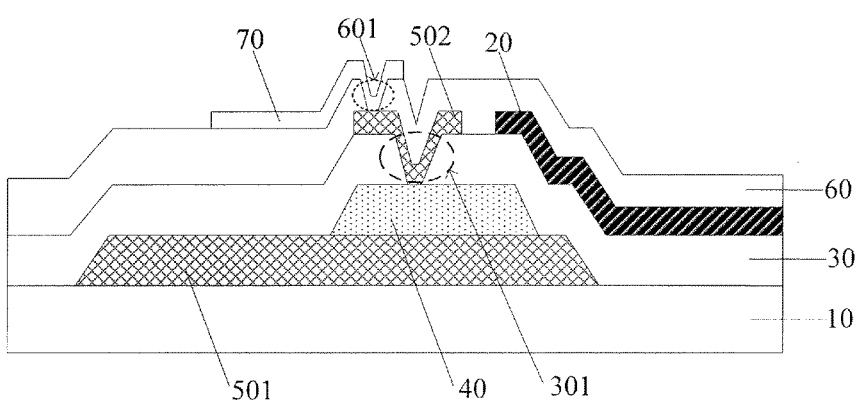
FIG. 6 is a structural schematic view of an array substrate according to an embodiment of the present invention.
Figure 7:
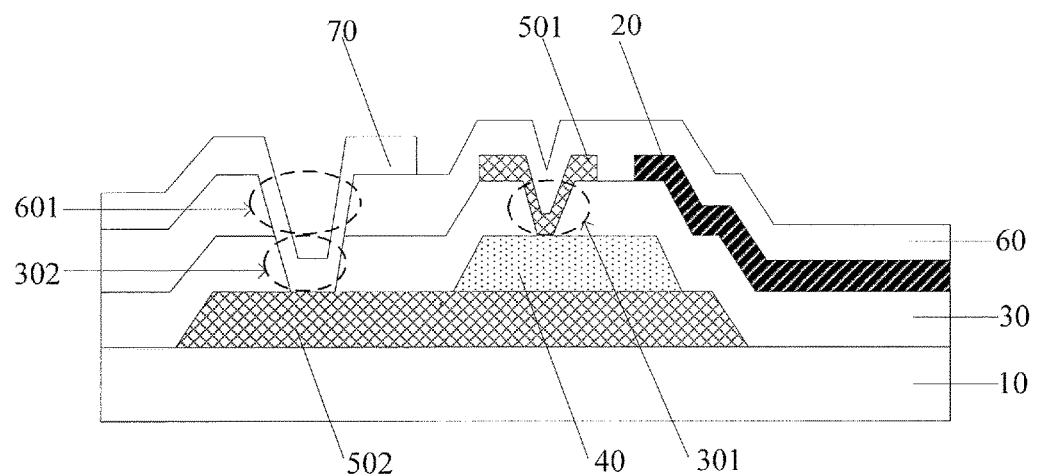
FIG. 7 is a structural schematic view of another array substrate according to an embodiment of the present invention.

An embodiment of the present invention further provides an array substrate, as shown in FIGS. 6 and 7, the array substrate comprises the above thin film transistor and a pixel electrode 70, wherein the pixel electrode 70 is connected with the drain electrode 502 of the thin film transistor. Exemplarily, the array substrate may further comprise a protection layer 60.

Optionally, as shown in FIG. 6, when the source electrode 501 of the above thin film transistor is provided between the base substrate 10 and the active layer 40, the gate insulation layer 30 is provided between the drain electrode 502 and the active layer 40, the gate insulation layer 30 is provided with a first through hole 301 and the drain electrode 502 contacts the active layer 40 through the first through hole 301; and in a case that the gate electrode 20 and the drain electrode 502 are provided in the same layer, the pixel electrode 70 is connected with the drain electrode 502 through a second through hole 601 in the protection layer 60 provided above the gate electrode and the drain electrode.

Optionally, as shown in FIG. 7, when the drain electrode 502 of the above thin film transistor is provided between the base substrate 10 and the active layer 40, the gate insulation layer 30 is provided between the source electrode 501 and the active layer 40, the gate insulation layer 30 is provided with a first through hole 301 therein and the source electrode 501 contacts the active layer 40 through the first through hole 301; and in a case that the gate electrode 20 and the source electrode 501 are provided in the same layer, the pixel electrode 70 is connected with the drain electrode 502 through a second through hole 601 in the protection layer 60 provided above the gate electrode and the source electrode and a third through hole 302 provided in the gate insulation layer 30.

Here, the second through hole 601 and the third through hole 302 may be formed by one etching process.

The two structures of the array substrate will be described in further in detail by providing two embodiments.

A Third Embodiment

The third embodiment provides an array substrate, as shown in FIG. 6, from bottom to top, the array substrate sequentially comprises a base substrate 10, a source electrode 501 and a data line (not shown in Figs.) connected therewith provided on the base substrate 10, an active layer 40 provided above the source electrode, a gate insulation layer 30 provided above the active layer 40, a drain electrode 502 and a gate electrode 20 provided in the same layer above the gate insulation layer 30 without connection and a gate line (not shown in Figs.) connected with the gate electrode, wherein the gate insulation layer 30 is provided with a first through hole 301 therein, and the drain electrode 502 contacts the active layer 40 through the first through hole 301. In addition, the array substrate further comprises a protection layer 60 and a pixel electrode 70 provided above the protection layer 60, wherein the pixel electrode 70 is connected with the drain electrode 502 through a second through hole 601 provided in the protection layer 60.

Herein, the source electrode 501, the active layer 40 provided above the source electrode 501, the gate insulation layer 30 provided above the active layer and the drain electrode 502 and the gate electrode 20 provided in the same layer above the gate insulation layer without connection constitute the thin film transistor.

A Fourth Embodiment

The present embodiment provides an array substrate, as shown in FIG. 7, from bottom to top, the array substrate comprises: a base substrate 10, a drain electrode 502 provided on the base substrate 10, an active layer 40 provided above the drain electrode, a gate insulation layer 30 provided above the active layer 40, a source electrode 501 and a data line (not shown in Figs.) connected therewith and a gate electrode 20 provided in a same layer above the gate insulation layer 30, and a gate line (not shown in Figs.) connected with the gate electrode 20, wherein the source electrode 501 is not connected with the gate electrode 20, the gate insulation layer 30 is provided with a first through hole 301 therein, the source electrode 501 contacts the active layer 30 through the first through hole 301. In addition, the array substrate further comprises a protection layer 60 and a pixel electrode 70 provided on the protection layer 60. The pixel electrode 70 is connected with the drain electrode 502 through a second through hole 601 provided in the protection layer 60 and a third through hole 302 in the gate insulation layer 30.

Herein the drain electrode 502, the active layer 40 provided above the drain electrode 502, the gate insulation layer 30 provided above the active layer and the source electrode 501 and the gate electrode 20 provided in the same layer above the gate insulation layer without connection constitute the thin film transistor.

In the array substrate provided by an embodiment of the present invention, since the channel length of the thin film transistor is determined by the thickness of the active layer, by properly setting the thickness of the active layer, the channel length can be reduced, and thus an ON-state current of the thin film transistor can be increased and hence the characteristic of the thin film transistor can be improved.

In addition, the array substrate provided by an embodiment of the present invention may be used as an array substrate in a TN mode, an Advanced-Super Dimension Switch mode, an In-Plane Switching (IPS) mode liquid crystal display device, and also may be used as the array substrate in an organic light-emitting diode display (OLED), and so on.

Exemplarily, in the Advanced-Super Dimension Switch mode liquid crystal display device, an electric field generated by fringes of slit electrodes in the same plane and an electric field generated between the slit electrode layer and a plate electrode layer can constitute a multi-dimension electric field, so as to make liquid crystal molecules oriented in all directions between the slits electrodes and directly above the electrodes inside a liquid crystal cell capable of rotating, thus improving the operating efficiency of liquid crystal and increasing the light transmittance. The ADS technology can improve the displaying quality of a TFT-LCD, and has advantages of high resolution, high transmittance, low power consumption, wide viewing angle, high aperture ratio, low chromatic aberration, no push Mura, etc. The organic light-emitting diode display has the characteristic of being self-luminous, large viewing angle, low power consumption and so on.

Figure 8:
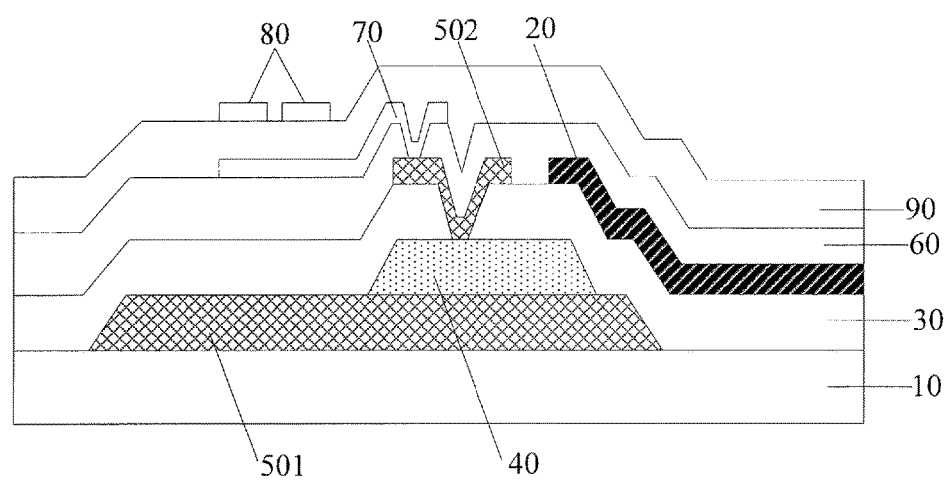
FIG. 8 is a structural schematic view of an array substrate including a common electrode according to an embodiment of the present invention.
Figure 9:
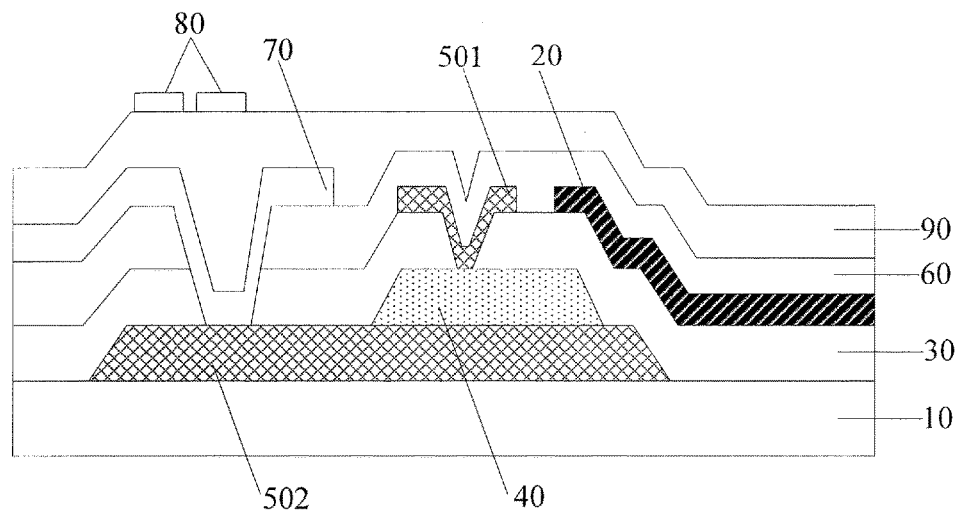
FIG. 9 is a structural schematic view of another array substrate including a common electrode according to an embodiment of the present invention.

Therefore, for an array substrate suitable for the Advanced-Super Dimension Switch mode liquid crystal display device, as shown in FIG. 8 and FIG. 9, the array substrate further comprises a passivation layer 90 and a common electrode 80.

An embodiment of the present invention provides an array substrate including the above thin film transistor, a pixel electrode and a common electrode. In an aspect, since a channel length of the thin film transistor is determined by a thickness of the active layer, by properly setting the thickness of the active layer, the channel length can be shortened, and thus an ON-state current of the thin film transistor can be increased, and hence the characteristic of the thin film transistor can be improved. In another aspect, since the pixel electrode and the common electrode are both on the array substrate, when the array substrate is applied in a display device, the display device can have the advantages of high resolution, high transmittance, low power consumption, wide viewing angle, high aperture ratio, low chromatic aberration, no push Mura, etc.

An embodiment of the present invention further provides a method for manufacturing a thin film transistor, and the method comprises: forming a gate electrode 20, a gate insulation layer 30, an active layer 40, a source electrode 501 and a drain electrode 502 on a base substrate 10, wherein along a direction perpendicular to the base substrate, the source electrode 501 and the drain electrode 502 are respectively formed at opposite both sides of the active layer 40, and the source electrode 501 and the drain electrode 502 contacts the active layer 40. Furthermore, the gate electrode and the source/drain electrode are formed in one patterning process, and the gate electrode is not connected with the drain/source electrode, and the gate insulation layer is provided between the gate electrode and the active layer.

An embodiment of the present invention further provides a method for manufacturing a thin film transistor, and the method comprises: forming a gate electrode, a gate insulation layer and an active layer on a base substrate and respectively forming a source electrode and a drain electrode contacting the active layer at opposite both sides of the active layer along a direction perpendicular to the base substrate. Since a channel length of the thin film transistor is determined by a thickness of the active layer, by properly setting the thickness of the active layer between the source electrode and the drain electrode, the channel length can be reduced, and thus an ON-state current of the thin film transistor can be increased, and the characteristic of the thin film transistor can be improved.

Optionally, the respectively forming the source electrode 501 and the drain electrode 502 at opposite both sides of the active layer 40 comprises: forming the source electrode 501 between the base substrate 10 and the active layer 40, and forming the drain electrode 502 at a side of the active layer 40 away from the base substrate 10.

Furthermore, the forming the drain electrode 502 at a side of the active layer 40 away from the base substrate 10 comprises: forming the gate insulation layer 30 between the drain electrode 502 and the active layer 30 such that the drain electrode 502 contacts the active layer 40 through a first through hole 301 formed in the gate insulation layer 30; and forming the gate electrode 20 in the same layer as the drain electrode 502 without connecting with the drain electrode 502.

Hereinafter, the above method for manufacturing a thin film transistor will be described in detail.

A Fifth Embodiment

Figure 10:
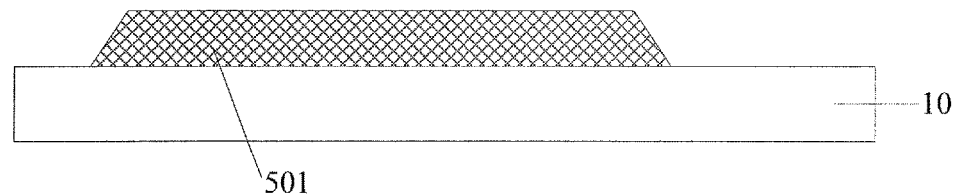
FIGS. 10 to 14 are schematic views showing a process for manufacturing two kinds of thin film transistor according to an embodiment of the present invention.

The fifth embodiment of the present invention provides a method for manufacturing a thin film transistor, and the method comprises the steps of:

S101. preparing a metal film on a base substrate 10 and forming a source electrode 501 as shown in FIG. 10 by one patterning process.

Exemplarily, the metal film with a thickness of 1000 Å to 7000 Å is prepared on the base substrate 10 by using a magnetron sputtering method. Metal material for the metal film generally may comprise molybdenum, aluminum, aluminum nickel alloy, molybdenum tungsten alloy, chromium or copper; alternatively, the metal film may be a combined structure of the above metal material. Then, by using the patterning process comprising exposure, development, etching, removing and so on, the source electrode 501 is formed on a certain area of the base substrate.

S102. forming an active layer film on the base substrate 10 obtained after the step S101, and then by one patterning process, forming an active layer 40.

Figure 11:
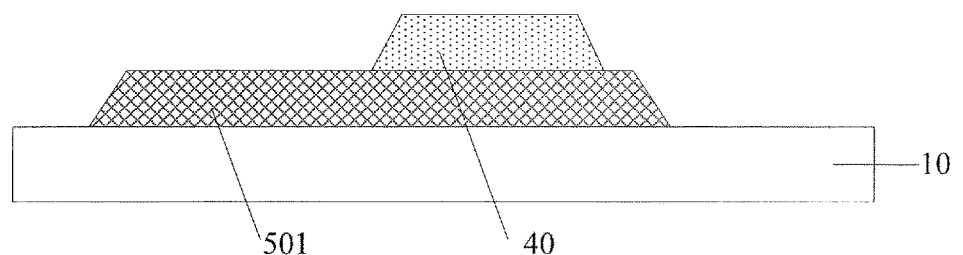

Exemplarily, a metal oxide semiconductor film may be deposited on the base substrate 10 on which the source electrode 501 is formed by a chemical vapor deposition method. Then, by using the patterning process comprising exposure, development, etching, removing and so on, the active layer 40 as shown in FIG. 11 is formed on a certain area of the base substrate.

Figure 12:
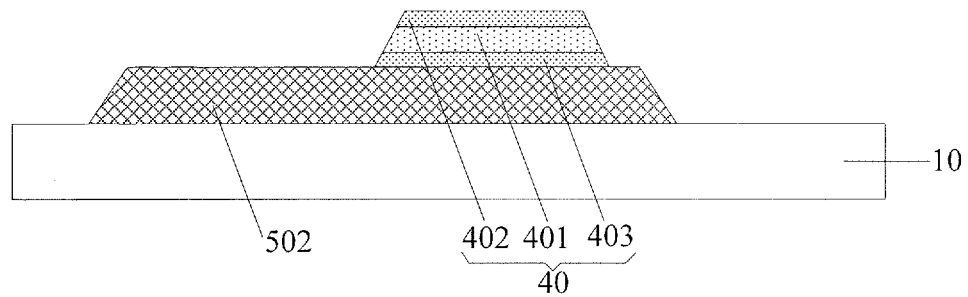

Alternatively, an amorphous silicon film and n+ amorphous silicon film with a thickness of 1000 Å to 6000 Å may also be deposited on the base substrate with the source electrode 501 formed thereon, and then by using the patterning process comprising exposure, development, etching, removing and so on, the active layer 40 as shown in FIG. 12 which comprises an amorphous silicon semiconductor layer 401 located in the middle thereof and a first ohmic contact layer 402 and a second ohmic contact layer 403 respectively formed above and below the amorphous silicon semiconductor layer 401 is formed on a certain area of the base substrate 10.

S103, forming an insulation film on the base substrate obtained after the step S102, and then by using one patterning process, forming a gate insulation layer 30 having a first through hole 301 therein.

Herein, the active layer 40 is exposed through the first through hole 301.

Figure 13:
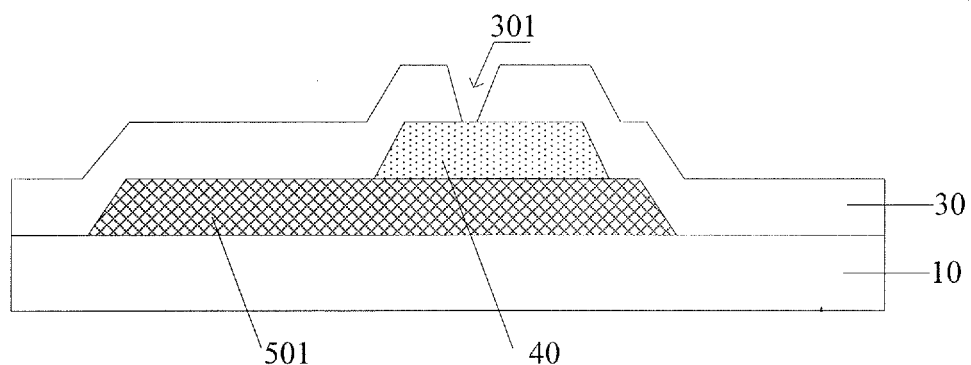
Figure 14:
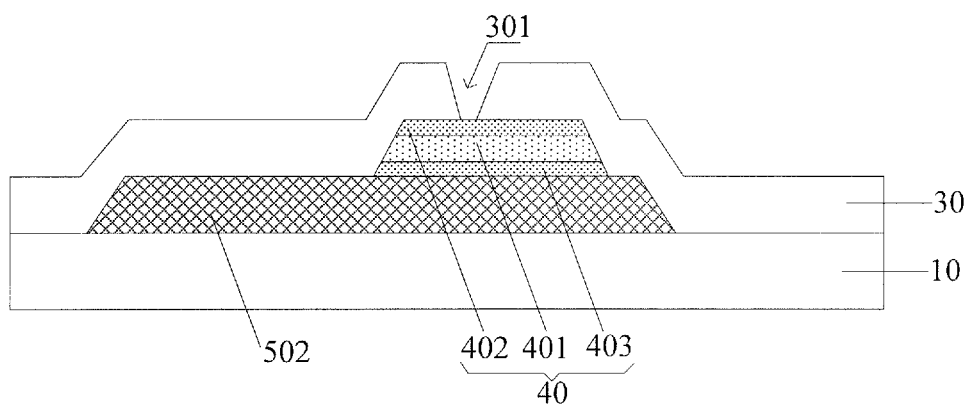

Exemplarily, the insulation film with a thickness of 1000 Å to 6000 Å may be continuously deposited on the base substrate by a chemical vapor deposition method. Material for the insulation film may be generally silicon nitride, silicon oxide, silicon oxynitride and so on. Then, by exposure, development and etching, the gate insulation layer 30 having the first through hole 301 as shown in FIG. 13 or FIG. 14 is formed.

S104, forming a metal film on the base substrate obtained after the step S103, and then by one patterning process, forming a drain electrode 502 as shown in FIG. 2 or FIG. 4, as well as a gate electrode 20, wherein the drain electrode 502 is not connected with the gate electrode 20, and the drain electrode 502 contacts the active layer 40 through the first through hole 301.

Exemplarily, a metal film with a thickness of 1000 Å to 7000 Å may be prepared on the base substrate by using a magnetron sputtering method. Metal material for the metal film generally may comprise molybdenum, aluminum, aluminum nickel alloy, molybdenum tungsten alloy, chromium or copper; alternatively, the metal film may be a combined structure of the above metal material. Then, by using the patterning process comprising exposure, development, etching, removing and so on, the drain electrode 502 is formed on a certain area of the base substrate such that the drain electrode 502 contacts the active layer 40 through the first through hole 301, and at the same time, the gate electrode 20 is formed.

The embodiment of the present invention further provides a method for manufacturing a thin film transistor, and the method comprises: sequentially forming a source electrode, an active layer, a gate insulation layer on a base substrate and forming a drain electrode and a gate electrode in the same layer and not connected to each other, wherein the source electrode contacts a lower surface of the active layer, the drain electrode contacts an upper surface of the active layer through a first through hole in the gate insulation layer. Since a channel length of the thin film transistor is determined by a thickness of the active layer, by properly setting the thickness of the active layer, the channel length can be reduced, and thus an ON-state current of the thin film transistor can be increased, and the characteristic of the thin film transistor can be improved.

For the array substrate comprising a poly-silicon thin film transistor manufactured by the above mentioned method, in addition to the above steps S101 to S104, the manufacturing method may further comprise: forming a protection layer 60 and a pixel electrode 70 as shown in FIG. 6 on the base substrate, wherein the pixel electrode 70 is electrically connected with the drain electrode 502 through a second through hole 601 formed in the protection layer 60.

Furthermore, the method may further comprise forming a passivation layer 90 and a common electrode 80 as shown in FIG. 8.

It is to be noted that the method for manufacturing the thin film transistor as provided by the embodiment of the present invention is not limited the above embodiments.

In addition, the method for manufacturing the thin film transistor according to the embodiment of the present invention may also be: forming the drain electrode 502 between the base substrate 10 and the active layer 40 and forming the source electrode 501 at a side of the active layer 40 away from the base substrate 10.

Furthermore, forming the source electrode 501 at a side of the active layer 40 away from the base substrate comprises: forming the gate insulation layer 30 between the source electrode 501 and the active layer 40 such that the source electrode 501 contacts the active layer 40 through the first through hole 301 formed in the gate insulation layer 30; and forming the gate electrode 20 in the same layer as the source electrode 501.

Hereinafter, with reference to the thin film transistor as shown in FIG. 3 or FIG. 5, the method is described. The method comprises the steps of:

S201, forming a metal film on a base substrate 10 and forming a drain electrode 502 by one patterning process;

S202, forming an active layer film on the base substrate 10 obtained after the step S201, and then by one patterning process, forming an active layer 40.

Herein, referring to FIG. 3, the active layer 40 is formed by depositing a metal oxide semiconductor film on the base substrate; alternatively, referring to FIG. 5, the active layer 40 comprises an amorphous silicon semiconductor layer 401 located in the middle thereof and a first ohmic contact layer 402 and a second ohmic contact layer 403 respectively forming above and below the amorphous silicon semiconductor layer, that is, is formed by depositing an amorphous silicon film and a n+ amorphous silicon film on the base substrate.

S203, forming an insulation film on the base substrate obtained after the step S202, and then by using one patterning process, forming a gate insulation layer 30 having a first through hole 301 therein as shown in FIG. 3 or FIG. 5, wherein the active layer 40 is exposed through the first through hole 301;

S204, forming a metal film on the base substrate obtained after the step S203, and then by one patterning process, forming a source electrode 501 as shown in FIG. 3 or FIG. 5, as well as a gate electrode 20, wherein the source electrode 501 contacts the active layer 40 through the first through hole 301 in the gate insulation layer 30.

The embodiment of the present invention further provides a method for manufacturing a thin film transistor, and the method comprises: sequentially forming a drain electrode, an active layer, a gate insulation layer on a base substrate and forming a source electrode and a gate electrode in the same layer and not connected to each other, wherein the drain electrode contacts a lower surface of the active layer, the source electrode contacts an upper surface of the active layer through a first through hole in the gate insulation layer. Since a channel length of the thin film transistor is determined by a thickness of the active layer, by properly setting the thickness of the active layer, the channel length can be reduced, and thus an ON-state current of the thin film transistor can be increased, and the characteristic of the thin film transistor can be improved.

For the array substrate including a poly-silicon thin film transistor manufactured by the above mentioned method, in addition to the above steps S201 to S204, the manufacturing method may further comprise forming a protection layer 60 as shown in FIG. 7 as well as a pixel electrode 70 on the base substrate, wherein the pixel electrode 70 is electrically connected with the drain electrode 502 through a second through hole 601 formed in the protection layer 60 and a third through hole 302 provided in the gate insulation layer 30.

Furthermore, the method may further comprise forming a passivation layer 90 and a common electrode 80 as shown in FIG. 9.

An embodiment of the present invention further provides a method for manufacturing a thin film transistor, and the method comprises: forming a gate electrode, a gate insulation layer and an active layer on a base substrate and respectively forming a source electrode and a drain electrode contacting the active layer at opposite both sides of the active layer along a direction perpendicular to the base substrate. Since a channel length of the thin film transistor is determined by a thickness of the active layer, by properly setting the thickness of the active layer between the source electrode and the drain electrode, the channel length can be reduced, and thus an ON-state current of the thin film transistor can be increased, and the characteristic of the thin film transistor can be improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A thin film transistor, comprising a gate electrode, a gate insulation layer, an active layer, a source electrode and a drain electrode provided on a base substrate, wherein along a direction perpendicular to the base substrate, the source electrode and the drain electrode are respectively provided at opposite both sides of the active layer, and the source electrode and the drain electrode contacts the active layer; wherein the gate electrode end the source/drain electrode are provided in the same layer, the gate electrode is not connected with the source/drain electrode and the gate insulation layer is provided between the gate electrode and the active layer;

wherein the drain electrode is provided between the base substrate and the active layer, and the source electrode is provided at a side of the active layer away from the base substrate.

2. The thin film transistor according to claim 1, wherein the gate insulation layer is provided between the source electrode and the active layer, and the source electrode contacts the active layer through a first through hole provided in the gate insulation layer.

3. The thin film transistor according to claim 1, wherein the active layer comprises a three-layer structure comprising an ohmic contact layer/an amorphous silicon semiconductor layer/an ohmic contact layer.

4. The thin film transistor according to claim 1, wherein the active layer is a metal oxide semiconductor active layer.

5. An array substrate, comprising a thin film transistor according to claim 1.

6. The array substrate according to claim 5, further comprising a protection layer and a pixel electrode, the drain electrode of the thin film transistor is provided between the base substrate and the active layer, the gate insulation layer is provided between the source electrode and the active layer, the source electrode contacts the active layer through a first through hole provided in the gate insulation layer, the gate electrode and the source electrode are provided in the same layer and are electrically insulated from each other, the gate insulation layer is provided between the gate electrode and the active layer, the protection layer is provided on the gate electrode and the source electrode, and the pixel electrode is connected with the drain electrode through a second through hole provided in the protection layer and a third through hole in the gate insulation layer.

7. The array substrate according to claim 5, further comprising a protection layer and a pixel electrode, the drain electrode of the thin film transistor is provided between the base substrate and the active layer, the gate insulation layer is provided between the source electrode and the active layer, the source electrode contacts the active layer through a first through hole provided in the gate insulation layer, the gate electrode and the source electrode are provided in the same layer and are electrically insulated from each other, the gate insulation layer is provided between the gate electrode and the active layer, the protection layer is provided on the gate electrode and the source electrode, and the pixel electrode is connected with the source electrode through a second through hole provided in the protection layer.

8. The array substrate according to claim 6, further comprising:

a passivation layer, covering the pixel electrode; and
a common electrode, provided on the passivation layer.

9. The array substrate according to claim 6, wherein the active layer comprises a three-layer structure comprising an ohmic contact layer/an amorphous silicon semiconductor layer/an ohmic contact layer.

10. The array substrate according to claim 6, wherein the active layer is a metal oxide semiconductor active layer.

11. A method for manufacturing a thin film transistor, comprising:

forming a gate electrode, a gate insulation layer, an active layer, a source electrode and a drain electrode on a base substrate, wherein the source electrode and the drain electrode are respectively provided at opposite both sides of the active layer along a direction perpendicular to the base substrate, and the source electrode and the drain electrode contacts the active layer;

wherein the gate electrode and the source electrode/drain electrode are formed in one same patterning process, and the gate electrode is not connected with the source electrode/drain electrode, and the gate insulation layer is provided between the gate electrode and the active layer, wherein the forming the source electrode and the drain electrode at opposite both sides of the active layer comprises: forming the drain electrode between the base substrate and the active layer, and forming the source electrode at a side of the active layer away from the base substrate.

12. The method according to claim 11, wherein the forming the source electrode at a side of the active layer away from the base substrate comprises: forming the gate insulation layer between the source electrode and the active layer, wherein the source electrode contacts the active layer through a through hole formed in the gate insulation layer.

* * * * *